United States Patent
Sano et al.

(10) Patent No.: US 9,982,868 B2
(45) Date of Patent: May 29, 2018

(54) PHOSPHOR-CONTAINING MEMBER AND LIGHT EMITTING DEVICE CONTAINING THEREOF

(71) Applicant: NICHIA CORPORATION, Anan-shi, Tokushima (JP)

(72) Inventors: Masahiko Sano, Anan (JP); Toshiaki Yamashita, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days. days.

(21) Appl. No.: 15/709,886

(22) Filed: Sep. 20, 2017

(65) Prior Publication Data

US 2018/0080631 A1    Mar. 22, 2018

(30) Foreign Application Priority Data

Sep. 21, 2016  (JP) ................. 2016-184119

(51) Int. Cl.
H01J 1/62       (2006.01)
F21V 29/85      (2015.01)
F21V 29/507     (2015.01)
F21V 9/16       (2006.01)
F21K 9/64       (2016.01)

(52) U.S. Cl.
CPC ............... *F21V 9/30* (2018.02); *F21K 9/64* (2016.08); *F21V 9/16* (2013.01); *F21V 29/507* (2015.01); *F21V 29/86* (2015.01)

(58) Field of Classification Search
USPC ........................................ 313/503, 498, 506
See application file for complete search history.

(56) References Cited

U.S. PATENT DOCUMENTS

| | | |
|---|---|---|
| 2014/0339582 A1 | 11/2014 | Matsumura et al. |
| 2015/0103511 A1 | 4/2015 | Miyashita |
| 2015/0207045 A1 | 7/2015 | Wada et al. |
| 2016/0195244 A1 | 7/2016 | Harada |
| 2017/0137706 A1 | 5/2017 | Fujita et al. |

FOREIGN PATENT DOCUMENTS

| | | |
|---|---|---|
| JP | 2002-080270 A | 3/2002 |
| JP | 2002-192655 A | 7/2002 |
| JP | 2011-142000 A | 7/2011 |
| JP | 2011-165572 A | 8/2011 |
| JP | 2012-129135 A | 7/2012 |
| JP | 2015-076594 A | 4/2015 |
| JP | 2015-119046 A | 6/2015 |
| JP | 2015-138838 A | 7/2015 |

(Continued)

OTHER PUBLICATIONS

Extended European Search Report of the corresponding European Patent Application No. 17191868.3, dated Jan. 9, 2018.

*Primary Examiner* — Vip Patel

(57) ABSTRACT

A phosphor-containing member includes a base portion made of a diffuse reflective ceramic, and a plurality of phosphor portions each containing a phosphor and made of a ceramic. The plurality of phosphor portions are disposed directly on an upper surface of the base portion and are spaced apart from each other. A light emitting device includes the phosphor-containing member and a light source that is spaced apart from the phosphor-containing member and configured to irradiate light for exciting the phosphors on an upper surface of each of the phosphor portions.

21 Claims, 5 Drawing Sheets

(56) References Cited

FOREIGN PATENT DOCUMENTS

| | | |
|---|---|---|
| JP | 2016-018878 A | 2/2016 |
| JP | 2016-027613 A | 2/2016 |
| JP | 2016-127199 A | 7/2016 |
| WO | 2012-169289 A1 | 12/2012 |
| WO | 2015-135839 A1 | 9/2015 |

PHOSPHOR-CONTAINING MEMBER AND LIGHT EMITTING DEVICE CONTAINING THEREOF

CROSS-REFERENCE TO RELATED APPLICATION

This application claims priority to Japanese Patent Application No. 2016-184119 filed on Sep. 21, 2016, the disclosure of which is hereby incorporated by reference in its entirety.

BACKGROUND

The present invention relates to a phosphor-containing member and a light emitting device containing the phosphor-containing member.

In the light source device discussed in JP2012-129135A, a plurality of phosphor pieces (corresponding to the "phosphor portions" in this specification) are disposed on an upper surface of a light reflective substrate (corresponding to the "base portion" in this specification) via a joining member made of a metal material. The phosphor pieces and a light source are disposed separately from each other, and fluorescence is extracted by a reflection method from a surface on the side where the excitation light from the light source is incident.

SUMMARY

One object of the present disclosure is to provide a phosphor-containing member which can be obtained that reduces color unevenness and makes it easier to suppress detachment of the phosphor portion in the case where the phosphor-containing member is used in combination with a light source.

A certain embodiment of the present disclosure includes a phosphor-containing member which includes a base portion made of a diffuse reflective ceramic, and a plurality of phosphor portions each containing a phosphor and made of a ceramic, and the plurality of phosphor portions are disposed directly on an upper surface of the base portion and spaced apart from each other.

Another embodiment of the present disclosure includes a light emitting device which includes the phosphor-containing member as described above and a light source that is disposed at a location spaced apart from the phosphor-containing member and configured to irradiate light for exciting the phosphors to an upper surface of the base portions.

DESCRIPTION

Figure 1:
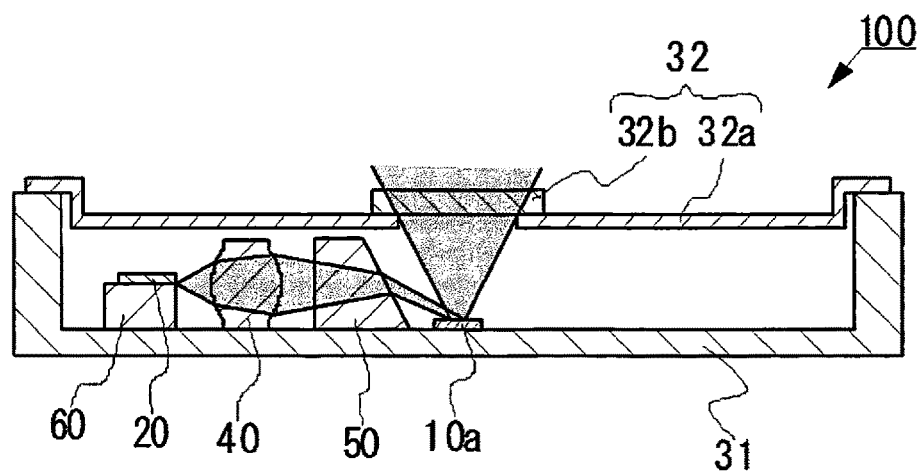
FIG. 1 is a cross sectional view of a light emitting device according to a first embodiment.

Certain embodiments of the present invention will be described below with reference to the accompanying drawings. In the embodiments in the below are intended to embody the technological concept of the present invention, and are not intended to limit the scope of the present invention. Also, the sizes and the positional relationship of the members described in the drawings may be exaggerated for the sake of clarity.

First Embodiment

Figure 2:
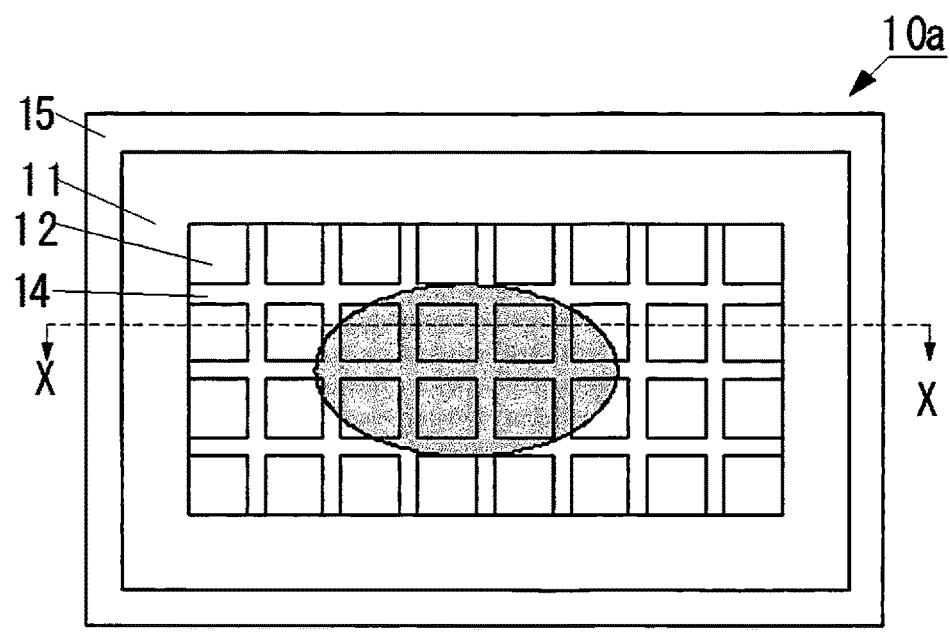
FIG. 2 is a top view of a phosphor-containing member.
Figure 3:
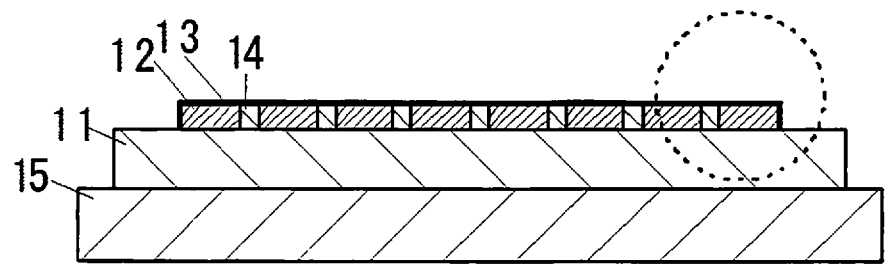
FIG. 3 is a cross sectional view taken along the X-X line in FIG. 2.
Figure 4:
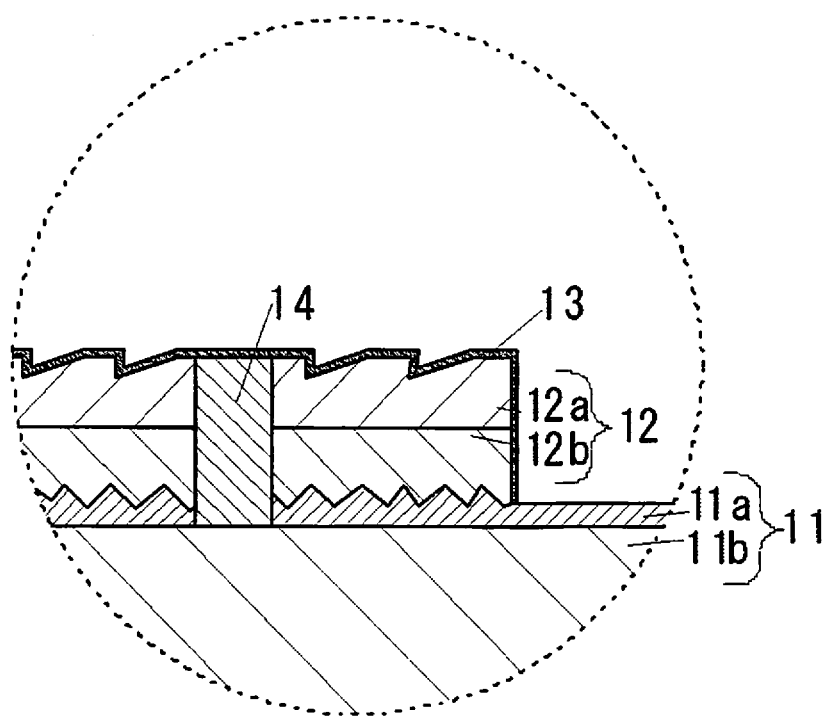
FIG. 4 is an enlarged view of a region at the inside of the broken line frame in FIG. 3.

FIG. 1 is a cross sectional view of a light emitting device 100 according to a first embodiment, FIG. 2 is a top view of a phosphor-containing member 10a (i.e., a view seen from a light emission surface side), FIG. 3 is a cross sectional view taken along the X-X line in FIG. 2, and FIG. 4 is an enlarged view of a region at the inside of the broken line frame in FIG. 3. In FIG. 2, illustration of an optical film 13 is omitted for the sake of easy understanding of the configuration of the members.

The light emitting device 100 includes a phosphor-containing member 10a and a light source 20 that is disposed at a location spaced away from the phosphor-containing member 10a and configured to irradiate light onto an upper surface of the phosphor portions 12 of the phosphor-containing member 10a. The phosphor-containing member 10a includes a base portion 11 made of a diffuse reflective ceramic, and a plurality of phosphor portions 12 each including a phosphor and being made of a ceramic. The plurality of phosphor portions 12 are spaced apart from each other and are disposed directly on an upper surface of the base portion 11.

With this arrangement, it is possible to obtain a phosphor-containing member with which color unevenness of emitted light can be reduced and in which the phosphor portions are less likely to detached.

A conventional light emitting device includes a plurality of phosphor portions disposed on an upper surface of the base portion via a metal material. However, specular reflection easily occurs at metal materials. Therefore, a part of light that is emitted from the light source and has entered an interior of the phosphor portions proceeds downward, is specular-reflected by the metal material, and extracted to the outside of the phosphor portions without subjecting wavelength conversion. For example, in the case where blue light is emitted from the light source, the blue light incident on the upper surfaces of the phosphor portions obliquely from an upper left side thereof tends to be reflected obliquely upward to a right side, so that the blue light tends to have high intensity when the upper surfaces of the phosphor portions are viewed obliquely from the upper right side. Meanwhile, the fluorescence emitted from the phosphor portions is mainly emitted toward directly above the phosphor portions. Therefore, with the conventional light emitting device, color unevenness of emitted light tends to occur in the case where the phosphor-containing member is used in combination with a light source. Also, in order to suppress a decrease in luminance due to light scattering, an attempt to reduce the width of the phosphor portions has been made in conventional light emitting devices, but if the width of the phosphor portions is reduced, the contact area between the phosphor portions and the metallic material is also reduced. Because a metal material has a thermal expansion coefficient higher than that of ceramics, thermal expansion and contraction are repeated due to heat generated in the phosphor portions and radiated to the bonding material made of a metal material, which may cause detachment of the phosphor portions more easily.

By contrast, in the phosphor-containing member 10a according to the present embodiment, the plurality of phosphor portions 12 made of a ceramic are arranged directly on the upper surface of the base portion 11 made of a diffuse reflective ceramic. Diffuse reflection (i.e., scattering reflection) occurs at a ceramic material more easily than at a metal material. With the phosphor portions 12 disposed directly on the base portion 11, light from the light source 20 (hereinafter referred to as "first light") is more likely to be reflected while being diffused at the upper surface of the base portion 11, so that color unevenness of light emitted from the light emitting device 100 can be reduced. Also, in the present embodiment, both the base portion 11 and the phosphor portions 12 are made of ceramic, which allows, even if the width of the phosphor portions 12 is reduced, the phosphor portions 12 to be easily prevented from being detached from the base portion 11.

FIG. 1 shows a cross sectional view of a laser package as the light emitting device 100. The light emitting device 100 has a base 31 and a cover 32 bonded to the base 31, and the space defined by the base 31 and the cover 32 is a sealed space. At the inside of this space, a semiconductor laser element, which serve as the light source 20, and the phosphor-containing member 10a are disposed. The cover 32 includes a frame 32a made of metal or the like, and a light-transmissive part 32b made of glass or the like. The light-transmissive part 32b is arranged to close the opening provided to the frame 32a. In the present specification, the light emitting surface side of the light emitting device 100 (i.e., an upper side of respective end surface views; for example, an upper side of FIG. 1) is referred to as the "upper side", and the opposite side thereof (i.e., a lower side of respective end views; for example, a lower side of FIG. 1) is referred to as the "lower side".

In the present embodiment, the semiconductor laser element as the light source 20 is mounted on the base 31 via a sub-mount 60 so that the optical axis of the first light is substantially parallel to the lower surface of the base 31. A prism 50 is disposed in the emission direction of the first light emitted laterally from the semiconductor laser element, and the first light is bent downward by the prism 50. Accordingly, the first light can be irradiated on the upper surfaces of the phosphor portions 12. Also, in the present embodiment, a lens 40 is disposed between the light source 20 and the prism 50 in view of the spread angle of the first light. A converging lens or a collimating lens can be selected for the lens 40. In the case where the spread angle of the first light is small, a lens may not be provided.

As shown in FIG. 2, in the present embodiment, in a top view, the area of a region of the phosphor-containing member 10a irradiated by the light from the light source 20 is larger than a total of the areas of the upper surfaces of two or more phosphor portions 12. With this structure, spreading of the first light in the phosphor-containing member 10a can be reduced, so that emission with higher luminance can be obtained. Furthermore, in the case where each of the phosphor portions 12 has a small area, the phosphor portions 12 are more likely to be detached due to the difference in the coefficient of thermal expansion between the phosphor portions 12 and the base portion 11, but with this embodiment, detachment of the phosphor portions 12 can be reduced.

The region of the phosphor-containing member 10a irradiated with the light from the light source 20 preferably has an area of twice to 10,000 times, more preferably five times to and 5,000 times, and even more preferably at 100 times to 1000 times as large as the area of the upper surface of each of the phosphor portions 12. With an area of twice as large as the area of the upper surface of each of the phosphor portions 12 or greater, spreading of light in the phosphor-containing member 10a can be reduced, so that luminance can be easily increased. Also, with an area of 10,000 times as large as the upper surface of each of the phosphor portions 12 or smaller, a size of each of the phosphor portions 12 may not be excessively reduced, which allows easy manufacturing of the phosphor-containing member 10a.

As shown in FIG. 3, the phosphor-containing member 10a in the present embodiment includes the base portion 11 disposed on an upper surface of a heat dissipation component 15, the plurality of the phosphor portions 12 disposed directly on an upper surface of the base portion 11, a light shielding portion 14 disposed between the phosphor portions 12, and an optical film 13 disposed on the upper surface of each of the phosphor portions 12 and the upper surface of the light shielding portion 14. The main constituent elements of the phosphor-containing member 10a will be described below.

Base Portion 11

The base portion 11 is made of a diffuse reflective ceramic material, and a plurality of phosphor portions 12 are disposed thereon.

In the present embodiment, as shown in FIG. 4, the base portion 11 has a first region 11a in contact with the phosphor portions 12, and a second region 11b located below the first region 11a. The first region 11a has a reflectance with respect to light for exciting the phosphors (i.e., first light in the present embodiment) that is higher than that of the second region 11b. With this arrangement, good light reflection can be ensured in the first region 11a, while good strength can be ensured also in the second region 11b. This will be described below in detail.

In order to reduce deterioration of the phosphors due to heat, a material having a sintering temperature lower than the sintering temperature of the phosphor portions can be used for a material of the base portion 11 in a region in contact with the phosphor portions. Examples of a method of arranging the phosphor portions directly on the upper surface of the base portion include a method in which sintered body obtained by pre-firing as the phosphor portion is disposed on an upper surface of a ceramic powder, a constant pressure is applied, and the ceramic powder is further fired. At this time, in order to increase the strength of the base portion, it is necessary to fire the ceramic powder at a high temperature for a relatively long time, but heating for a relatively long time at high temperature causes grain-growth of the ceramic powder, which may lead to increase in optical transmittance of the base portion, so that scattering reflectivity of the base portion may be decreased. In view of this, in the present embodiment, the phosphor portions 12 are disposed directly on the upper surface of the base portion 11 by disposing, a sintered body of a ceramic material that has been fired at high temperature (corresponding to the "second region 11b" discussed below; hereinafter referred to as the "second member"), a ceramic powder (subsequently becoming the "first region 11a"; hereinafter referred to as the "first member"), and another sintered body to be the phosphor portions 12, in this order starting from a lower side, and then performing firing. With the second member that has been fired at a high temperature, strength of the base portion 11 can be ensured. Accordingly, the firing temperature at this time is a temperature that allows the second member and the phosphor portions 12 to be joined together via the first member, so the firing temperature can be a relatively low temperature. Therefore, in the present embodiment, the first region 11a allows for ensuring good light reflection, while the second region 11b allows for ensuring good strength. Alternatively, for example, the base portion 11 having uniform diffuse reflection and strength by disposing sintered phosphor portions on the upper surface of a ceramic powder and performing firing under pressure.

In the present embodiment, the main component of each of the first region 11a and the second region 11b is aluminum oxide. More specifically, first, aluminum oxide particles are fired at a high temperature to accelerate grain growth, so that the second region 11b having high light-transmittance and great strength is formed. Next, aluminum oxide particles are disposed on the upper surface of the second region 11b, and the aluminum oxide particles are fired at a firing temperature lower than the firing temperature of the second region 11b. This allows for forming a base portion 11 having a first region 11a with high diffuse reflection, albeit having lower strength than in the second region 11b. Alternatively, aluminum oxide and the like may be the main component of the base portion 11, and the base portion 11 may be made of materials with the same reflectance as an entirety of the base portion 11.

A height between the lower surface of the base portion 11 and the upper surface of the base portion 11 is preferably in the range of 200 μm to 2000 μm, and more preferably in the range of 400 μm to 1300 μm. With a height of 200 μm or more, good strength of the base portion 11 can be ensured, and with a height of 2000 μm or less, heat dissipation from the phosphor portions 12 can be improved.

Phosphor Portions 12

The phosphor portions 12 are made of a ceramic and contain a phosphor. In the present embodiment, the phosphor portions 12 are made of a phosphor and an additive. More specifically, in this embodiment, the phosphor portions 12 are made of a YAG (yttrium aluminum garnet) phosphor and an additive containing aluminum oxide. This allows the concentration of the phosphor in the phosphor portions 12 to be appropriately adjusted. Alternatively, the phosphor portions 12 made only of a phosphor may be used.

A single type of phosphor or two or more types of phosphors that are mixed can be used for the phosphor. In the case where the first light is blue light, selecting a phosphor for emitting yellow light or selecting a phosphor for emitting yellow light and a phosphor for emitting red light allows for obtaining white light, which is mixture of light with these colors. For example, a phosphor for emitting yellow light includes at least one of YAG and LAG. For example, a phosphor for emitting red light includes at least one of CASN and BESN. For example, the additives include at least one of aluminum oxide and yttrium oxide. A phosphor particle of the phosphor preferably has a diameter smaller than one side of the phosphor portion in a top view. This allows for easily scattering light at an inside of the phosphor portions 12.

As shown in FIG. 4, in the present embodiment, the upper and lower surfaces of each of the phosphor portions 12 are rough surfaces. With the upper surfaces of the phosphor portions 12 that are roughened, the first light can be easily incident on the phosphor portions 12. Also, with the lower surfaces of the phosphor portions 12 that are roughened, the first light can be easily scattered by the lower surfaces of the phosphor portions 12, so that color unevenness of light from the light emitting device 100 can be easily reduced. In the present embodiment, the upper and lower surfaces of the phosphor portions 12 are rough surfaces, but alternatively, either the upper surfaces or the lower surfaces of the phosphor portions 12 may be rough surfaces, or the upper and lower surfaces of the phosphor portions 12 may be substantially flat surfaces. In the present embodiment, a sintered body that is to serve as the phosphor portions and has upper and lower surfaces are prepared, the sintered body (i.e., phosphor portions) thus prepared is disposed on an upper surface of a ceramic powder disposed on an upper surface of a ceramic sintered body, and firing is then performed, which allows for obtaining the phosphor portions 12 with roughened upper and lower surfaces.

In the present embodiment, each of the phosphor portions 12 has a first region 12a and a second region 12b located below the first region 12a. The first region 12a has a reflectance with respect to light for exciting the phosphor lower than the reflectance of the second region 12b with respect to light for exciting the phosphor. With this arrangement, reflection of the first light on the upper surface of the first region 12a can be reduced, so the first light is more likely to be incident at the inside of the phosphor portions 12. For example, a single crystal phosphor is used for the first region 12a, and a sintered body of a phosphor and an additive is used for the second region 12b. This arrangement allows the grain boundary of the first region 12a to be reduced compared with the grain boundary of the second region 12b, so that the above-described effect can be more easily obtained.

In the present embodiment, the phosphor portions 12 has a substantially square shape when viewed from above. This allows for easily forming the phosphor portions 12. The phosphor portions 12 may have any appropriate shape, and may have a substantially circular shape or the like when viewed from above.

In the present embodiment, each of sides of the lower surface of each of the phosphor portions 12 preferably has a length of 5 μm to 500 μm, more preferably 10 μm to 200 μm, and even more preferably 15 μm to 50 μm. With the length of 5 μm or greater, detachment of the phosphor portions 12 can be easily prevented, and with the length of 500 μm or smaller, decrease in the luminance of the light emitting device can be easily prevented. The "length of each of sides of the lower surface of each of the phosphor portions 12" in the present specification refers to a length of a straight line connecting the two ends of the lower surface in a cross sectional view of each of the phosphor portions 12. Also, each of the phosphor portions 12 preferably has a thickness (i.e., the distance between the upper surfaces of the phosphor portions 12 and the lower surfaces of the phosphor portions 12) in a range of 30 μm to 300 μm, and more preferably 50 μm to 100 μm. With the thickness of 30 μm or greater, the phosphor can be easily contained in the phosphor portions 12, and therefore wavelength conversion of the first light can be facilitated. With the thickness of 300 μm or smaller, breakage of the phosphor portions 12 can be easily prevented.

The distance between adjacent phosphor portions 12 is preferably in a range of 1 μm to 100 μm, and more preferably 3 μm to 10 μm. With the distance of 1 μm or greater, gaps between the phosphor portions 12 can be easily formed, and with the distance of 100 μm or smaller, the area of the upper surfaces of the phosphor portions 12 included in the region irradiated with the first light can be increased.

Examples of a method of forming a plurality of phosphor portions 12 includes, arranging a fluorescent plate directly on the upper surface of the base portion 11 and then forming grooves from the upper surface side of the fluorescent plate by laser working. Forming the phosphor portions 12 by laser processing allows the distance between the adjacent phosphor portions 12 to be uniform easily. In the present embodiment, a plurality of phosphor portions 12 are formed by laser processing, but alternatively, a plurality of phosphor portions 12 that have been separated may be bonded to a single base portion 11.

Light Shielding Portion 14

In the present embodiment, a light shielding portion 14 is disposed between adjacent phosphor portions 12. This allows the light advancing toward lateral surfaces of the phosphor portions 12 to be reflected, so that decrease in luminance can be easily prevented. A known light reflecting material such as a metal material can be used for the light shielding portion 14. Also, the light shielding portion 14 may not be provided.

Optical Film 13

An optical film 13 can be disposed on the upper surfaces of the phosphor portions 12. For the optical film 13, an antireflective coating (AR coating) or the like can be used. This allows the first light to be easily incident on the phosphor portions 12. In the present embodiment, the optical film 13 is disposed on outermost lateral surfaces of the phosphor portions 12, the upper surfaces of the phosphor portions 12, and the upper surface of the light shielding portion 14.

Heat Dissipation Component 15

In the present embodiment, the base portion 11 is bonded to the heat dissipation component 15. This allows for improving heat dissipation from the base portion 11. For the heat dissipation component 15, a metal whose main component is copper, tungsten, molybdenum, etc., a ceramic having better heat dissipation than the base portion 11, or the like can be used. The heat dissipation component 15 and the base portion 11 can be bonded via a bonding material or the like, or can be performed without a bonding material. In this embodiment, the base portion 11 is bonded to the base 31 via the heat dissipation component 15, but alternatively, the base portion 11 may be bonded directly to the base 31 without interposing the heat dissipation component 15 therebetween.

Second Embodiment

Figure 5:
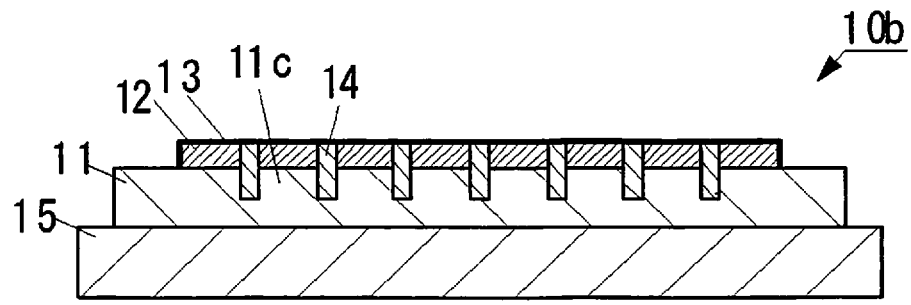
FIG. 5 is a cross sectional view of a light emitting device according to a second embodiment.

FIG. 5 is a cross sectional view of a phosphor-containing member 10b according to a second embodiment. The phosphor-containing member 10b is substantially the same as the configuration the phosphor-containing member 10a described above, except for the configuration described below. In the light emitting device 100 of the first embodiment, the phosphor-containing member 10b may be used instead of the phosphor-containing member 10a.

In the phosphor-containing member 10b, the base portion 11 includes a plurality of projecting portions 11c, and one phosphor portion 12 is disposed with respect to each of the projecting portions 11c. This structure allows for reducing lateral propagation of light entered the base portion 11 from the phosphor portions 12, so that luminance of emitted light can be easily increased.

In the present embodiment, each of the phosphor portions 12 has a thickness in an up-down direction (upper-lower direction) smaller than the thickness of respective one of the projecting portions 11c (i.e., the length in the up-down direction in FIG. 5). This allows for improving light extract efficiency while reducing color unevenness of light emitted from the light emitting device 100. Each of the projecting portions 11c preferably has a thickness in the range of 100 µm to 500 µm, and more preferably 200 µm to 400 µm. With the thickness of 100 µm or greater, lateral propagation of light inside the base portion 11 can be easily prevented even if the thickness of the phosphor portions 12 is reduced. With the thickness of 500 µm or smaller, decrease in heat dissipation from the phosphor portions 12 can be easily prevented.

Third Embodiment

Figure 6:
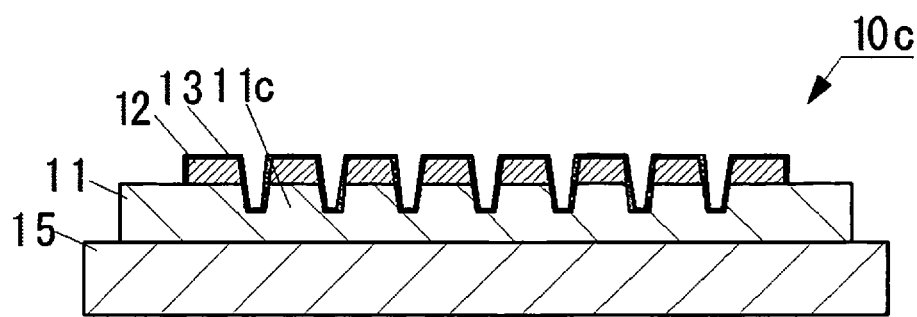
FIG. 6 is a cross sectional view of a light emitting device according to a third embodiment.

FIG. 6 is a cross sectional view of a phosphor-containing member 10c according to a third embodiment. The phosphor-containing member 10c is substantially the same as the configuration described for the phosphor-containing member 10a except for the configuration described below. In the first embodiment of light emitting device, the phosphor-containing member 10c can be used instead of the phosphor-containing member 10a.

In the phosphor-containing member 10c, the base portion 11 includes a plurality of projecting portions 11c, and one phosphor portion 12 is disposed with respect to each of the projecting portions 11c. Also, at least one lateral surface of each of the projecting portions 11c and at least one lateral surface of each of the phosphor portions 12 are sloped such that a width of each of the projecting portions 11c and a width of respective one of the phosphor portions 12 are reduced upward from a lower side as viewed in FIG. 6. Moreover, at least one lateral surface of each of the projecting portions 11c and at least one lateral surface of each of the phosphor portions 12 are sloped such that a width of each of the projecting portions 11c and a width of respective one of the phosphor portions 12 are reduced upward from a lower side as viewed in the right-left direction in FIG. 6, namely as viewed along the X-X line, for example, shown in FIG. 2. Furthermore, the light shielding portion 14 is not disposed between the phosphor portions 12. With the lateral surfaces of the phosphor portions 12 sloped such that a width of each of the projecting portions 11c and a width of each of the phosphor portions 12 are reduced upward from a lower side, light advancing toward the outside from the lateral surfaces of the phosphor portions 12 can be easily extracted upward.

Fourth Embodiment

Figure 7:
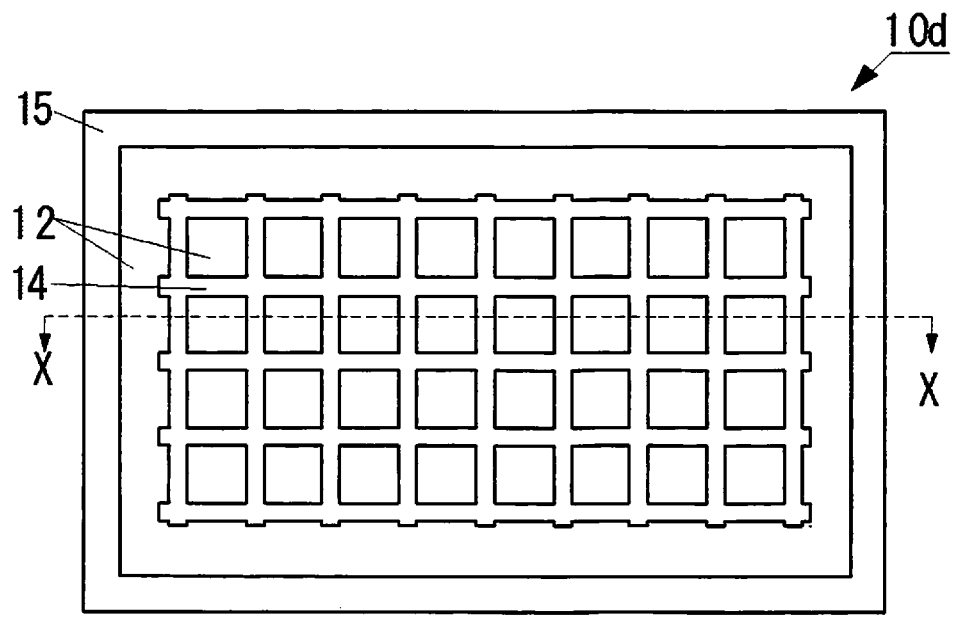
FIG. 7 is a top view of a phosphor-containing member according to a fourth embodiment.
Figure 8:
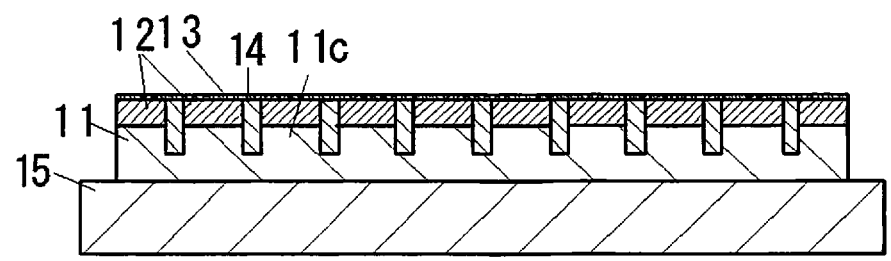
FIG. 8 is a cross sectional view taken along the X-X line in FIG. 7.

FIG. 7 is a top view of a phosphor-containing member 10d according to a fourth embodiment, and FIG. 8 is a cross sectional view taken along the X-X line in FIG. 7. The phosphor-containing member 10d is substantially the same as the configuration of the phosphor-containing member 10a described above except for the configuration described below. In the first embodiment of light emitting device, the phosphor-containing member 10d may be used instead of the phosphor-containing member 10a.

With the phosphor-containing member 10d, the base portion 11 includes a plurality of projecting portions 11c, and one phosphor portion 12 is disposed with respect to each of the projecting portions 11c. Also, when viewed from the upper surface side, the area of each of the phosphor portions 12 and the area of the base portion 11 are the same. Also, when viewed from the upper surface side, the outermost periphery of an entirety of the phosphor portions 12 corresponds to the outermost periphery of the base portion 11.

Further, the phosphor-containing member 10d includes a plurality of phosphor portions 12 and one continuous phosphor portion 12 that surrounds the plurality of phosphor portions 12 when viewed from the upper surface side. In the case where the size of the fluorescent plate is larger than the region irradiated with the first light, forming grooves by laser processing in only the region irradiated with the first light allows for reducing time for producing the phosphor-containing member. Even in the case where the area of the fluorescent plate is smaller than the area of the base portion 11 when viewed from the upper surface side, if the area of the fluorescent plate is larger than the region irradiated with the first light, grooves may be formed in the fluorescent plate by laser processing only in the region irradiated with the first light.

Fifth Embodiment

Figure 9:
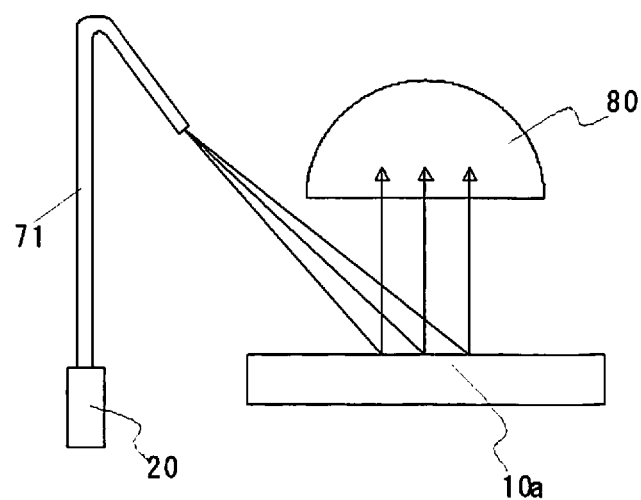
FIG. 9 is a schematic view of a light emitting device according to a fifth embodiment.

FIG. 9 is a schematic view of the laser module as a light emitting device 200 according to the fifth embodiment. As shown in FIG. 9, the light emitting device 200 includes a laser package, which serves as the light source 20, a phosphor-containing member 10a for converting the wavelength of a part of the first light, and an optical system 80, such as a lens or the like, on which light from the phosphor-containing member 10a is incident. The light emitted from the laser package is irradiated to the phosphor-containing member 10a through the light guide member 71. Also, light from the phosphor-containing member 10a that has passed through the optical system 80 is extracted to the outside through a window 90, for example. The configuration of the phosphor-containing member 10a is substantially the same as the configuration of the light-emitting device 100 described above.

In the present embodiment, a laser package or the like is disposed so that the first light emitted from the semiconductor laser element included in the laser package is incident on the upper surface of each of the phosphor portions 12. That is, a laser package or the like is disposed so that the first light is emitted in a direction different from the light extracting direction of the light emitting device (i.e., toward an upper side in FIG. 9). With this arrangement, even if the phosphor-containing member 10a is detached, extraction of the first light directly to the outside can be easily prevented. In FIG. 9, a laser package or the like is disposed so that the first light is incident obliquely to the upper surfaces of the phosphor portions 12. With this arrangement, a member for shielding light that advances from the phosphor-containing member 10a toward the laser package may not be disposed.

For the light guide member 71, an optical fiber can be used, for example. With the light guide member 71, even in the case where the laser package and the phosphor-containing member 10a are disposed apart from each other, the phosphor-containing member 10a can be irradiated with the first light while reducing spread of the beam diameter of the first light. The laser package may alternatively be disposed so that the light from the laser package is directly irradiated to the upper surface of each of the phosphor portions 12, without using the light guide member 71.

In the present embodiment, the phosphor-containing member 10b, the phosphor-containing member 10c, or the phosphor-containing member 10d may be used instead of the phosphor-containing member 10a.

Sixth Embodiment

Figure 10:
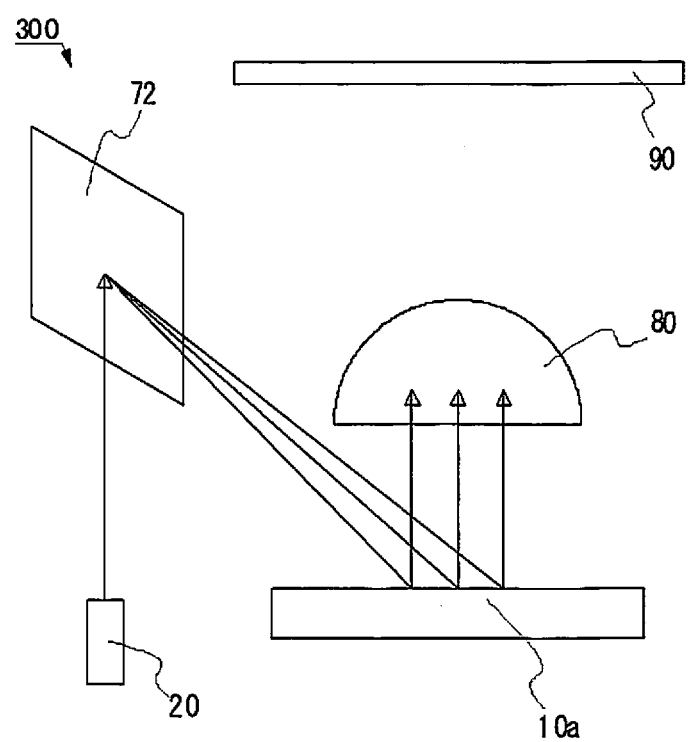
FIG. 10 is a schematic view of a light emitting device according to a sixth embodiment.

FIG. 10 is a schematic view of the laser module as a light emitting device 300 according to a sixth embodiment. The light emitting device 300 is substantially the same as the configuration of the light emitting device 200 described above except for the configuration described below. As shown in FIG. 10, the light emitting device 300 includes a light reflecting mechanism 72 configured to reflect the first light toward the phosphor-containing member 10a on an optical path of the first light. The light reflecting mechanism 72 includes, for example, a digital micromirror device having a large number of mirror surfaces. With this arrangement, a region in the phosphor-containing member 10a to be irradiated with the first light can be adjusted. According to the present embodiment, the same effect as in the light emitting device of the fifth embodiment can be obtained.

The phosphor-containing member and the light emitting device according to respective embodiments can be applied for vehicle installation, illumination and the like.

With the phosphor-containing member 10a, 10b, 10c, 10d in the embodiments, the phosphor-containing member 10a, 10b, 10c, 10d can be obtained that allows for reducing color unevenness of emitted light and suppressing detachment of the phosphor portions 12, in the case where the phosphor-containing member 10a, 10b, 10c, 10d is used in combination with the light source 20.

What is claimed is:

1. A phosphor-containing member comprising:
   a base portion made of a diffuse reflective ceramic; and
   a plurality of phosphor portions each containing a phosphor and made of a ceramic, the phosphor portions being disposed directly on an upper surface of the base portion and being spaced apart from each other.

2. The phosphor-containing member according to claim 1, wherein
   an upper surface of each of the phosphor portions is a rough surface.

3. The phosphor-containing member according to claim 1, wherein
   the base portion includes a plurality of projecting portions, and
   the phosphor portions are disposed with respect to the projecting portions, respectively.

4. The phosphor-containing member according to claim 3, wherein
   each of the phosphor portions has a thickness in an upper-lower direction smaller than a thickness of each of the projecting portions in the upper-lower direction.

5. The phosphor-containing member according to claim 4, wherein
   at least one lateral surface of each of the projecting portions is sloped such that a width of the projecting portions decreases as each of the projecting portions goes upward from a lower side, and
   at least one lateral surface of each the phosphor portions is sloped such that a width of each of the phosphor portions decreases as each of the phosphor portions goes upward from the lower side.

6. The phosphor-containing member according to claim 1, wherein
   the base portion includes a first region in contact with the phosphor portions, and a second region located lower than the first region, and
   the first region has a reflectance with respect to light for exciting the phosphor higher than a reflectance of the second region with respect to light for exciting the phosphor.

7. The phosphor-containing member according to claim 6, wherein the first region and the second region are made of the same material.

8. The phosphor-containing member according to claim 1, wherein
a lower surface of each of the phosphor portions is a rough surface.

9. The phosphor-containing member according to claim 1, wherein
each of the phosphor portions includes a first region and a second region located lower than the first region, and
the first region has a reflectance with respect to light for exciting the phosphor lower than a reflectance of the second region with respect to light for exciting the phosphor.

10. The phosphor-containing member according to claim 1, wherein
a main component of the base portion is aluminum oxide.

11. The phosphor-containing member according to claim 10, wherein
each of the phosphor portions further contains an additive, and
the additive contains aluminum oxide.

12. The phosphor-containing member according to claim 1, further comprising one continuous phosphor portion that surrounds the phosphor portions as viewed from an upper surface side of the phosphor-containing member.

13. The phosphor-containing member according to claim 12, wherein
a distance between adjacent phosphor portions of the phosphor portions is in a range of 1 μm to 100 μm.

14. The phosphor-containing member according to claim 1, wherein
each of the phosphor portions has a lower surface, and
a side of the lower surface of each of the phosphor portions has a length in a range of 5 μm to 500 μm.

15. The phosphor-containing member according to claim 1, further comprising a light shielding portion between the phosphor portions.

16. A light emitting device comprising:
the phosphor-containing member according to claim 1; and
a light source that is spaced apart from the phosphor-containing member and configured to irradiate light for exciting the phosphor to an upper surface of each of the phosphor portions.

17. The light emitting device according to claim 16, wherein
the light source includes a semiconductor laser element, and
an area of a region of the phosphor-containing member to be irradiated with the light irradiated from the light source is greater than a total of areas of upper surfaces of two or more of the phosphor portions.

18. The light emitting device according to claim 17, wherein
the light source is arranged to irradiate the light obliquely to the phosphor-containing member.

19. A method of manufacturing a phosphor-containing member, the method comprising:
providing a sintered body of a ceramic material having a diffuse reflection;
providing a phosphor portion made of a sintered body containing a phosphor;
disposing the phosphor portion on an upper surface of the sintered body of the ceramic material via a ceramic powder; and
firing the ceramic powder at a temperature lower than a temperature at which the sintered body of the ceramic material is sintered in the preparing of the sintered body of the ceramic material to obtain the phosphor-containing member that includes a base portion made of a diffuse-reflective ceramic and includes the phosphor portion which is directly bonded to the base portion.

20. The method of manufacturing a phosphor-containing member according to claim 19, further comprising
after obtaining the phosphor-containing member, forming grooves in at least the phosphor portion by using laser processing such that the grooves reach at least the base portion from an upper surface side of the phosphor portion.

21. The method of manufacturing a phosphor-containing member according to claim 20, wherein
the sintered body of the ceramic material and the ceramic powder are made of the same material.

* * * * *